US008294237B2

(12) United States Patent
Eriksen et al.

(10) Patent No.: US 8,294,237 B2
(45) Date of Patent: Oct. 23, 2012

(54) SEMICONDUCTOR STRUCTURAL ELEMENT

(75) Inventors: Gert Friis Eriksen, Greve (DK); Roger De Reus, Soborg (DK); Carsten Christensen, Bagsvoerd (DK)

(73) Assignee: Grundfos Management a/s, Bjerringbro (DK)

( * ) Notice: Subject to any disclaimer, the term of this patent is extended or adjusted under 35 U.S.C. 154(b) by 521 days.

(21) Appl. No.: 12/442,738

(22) PCT Filed: Sep. 4, 2007

(86) PCT No.: PCT/EP2007/007697
§ 371 (c)(1),
(2), (4) Date: Mar. 25, 2009

(87) PCT Pub. No.: WO2008/037334
PCT Pub. Date: Apr. 3, 2008

(65) Prior Publication Data
US 2010/0044810 A1    Feb. 25, 2010

(30) Foreign Application Priority Data
Sep. 25, 2006   (EP) .................................. 06019996

(51) Int. Cl.
*H01L 29/10*       (2006.01)
(52) U.S. Cl. ........................ 257/506; 257/414
(58) Field of Classification Search .................. 257/414, 257/506
See application file for complete search history.

(56) References Cited

U.S. PATENT DOCUMENTS

| 6,030,709 | A | 2/2000 | Jensen et al. |
| 2002/0132131 | A1 | 9/2002 | Bossmann et al. |
| 2003/0199139 | A1* | 10/2003 | Lee ............................... 438/240 |
| 2004/0113235 | A1* | 6/2004 | Coolbaugh et al. .......... 257/532 |
| 2005/0280069 | A1* | 12/2005 | Mizushima et al. .......... 257/314 |
| 2006/0219259 | A1* | 10/2006 | Oh et al. ........................... 134/2 |

FOREIGN PATENT DOCUMENTS

| DE | 198 42 105 A1 | 3/2000 |
| DE | 297 24 622 U1 | 8/2002 |
| EP | 0 736 757 A1 | 10/1996 |
| EP | 0 801 150 A2 | 10/1997 |
| EP | 1 217 095 A1 | 6/2002 |

OTHER PUBLICATIONS

English translation of Written Opinion of the International Searching Authority issued on Nov. 12, 2007 in counterpart International Application No. PCT/EP2007/007697.

* cited by examiner

*Primary Examiner* — Lex Malsawma
*Assistant Examiner* — Allen Parker
(74) *Attorney, Agent, or Firm* — Panitch Schwarze Belisario & Nadel LLP

(57) ABSTRACT

The semiconductor component is intended for a sensor, in particular for a pressure sensor or differential pressure sensor, and includes a semiconductor substrate (1) in or on which electronic components (3) are formed and connected. The semiconductor substrate (1) is provided with an electrically insulated layer, and a metal-containing amorphous protective layer is formed from two metal-containing layers which have different chemical compositions and are vapor-deposited in succession.

19 Claims, 3 Drawing Sheets

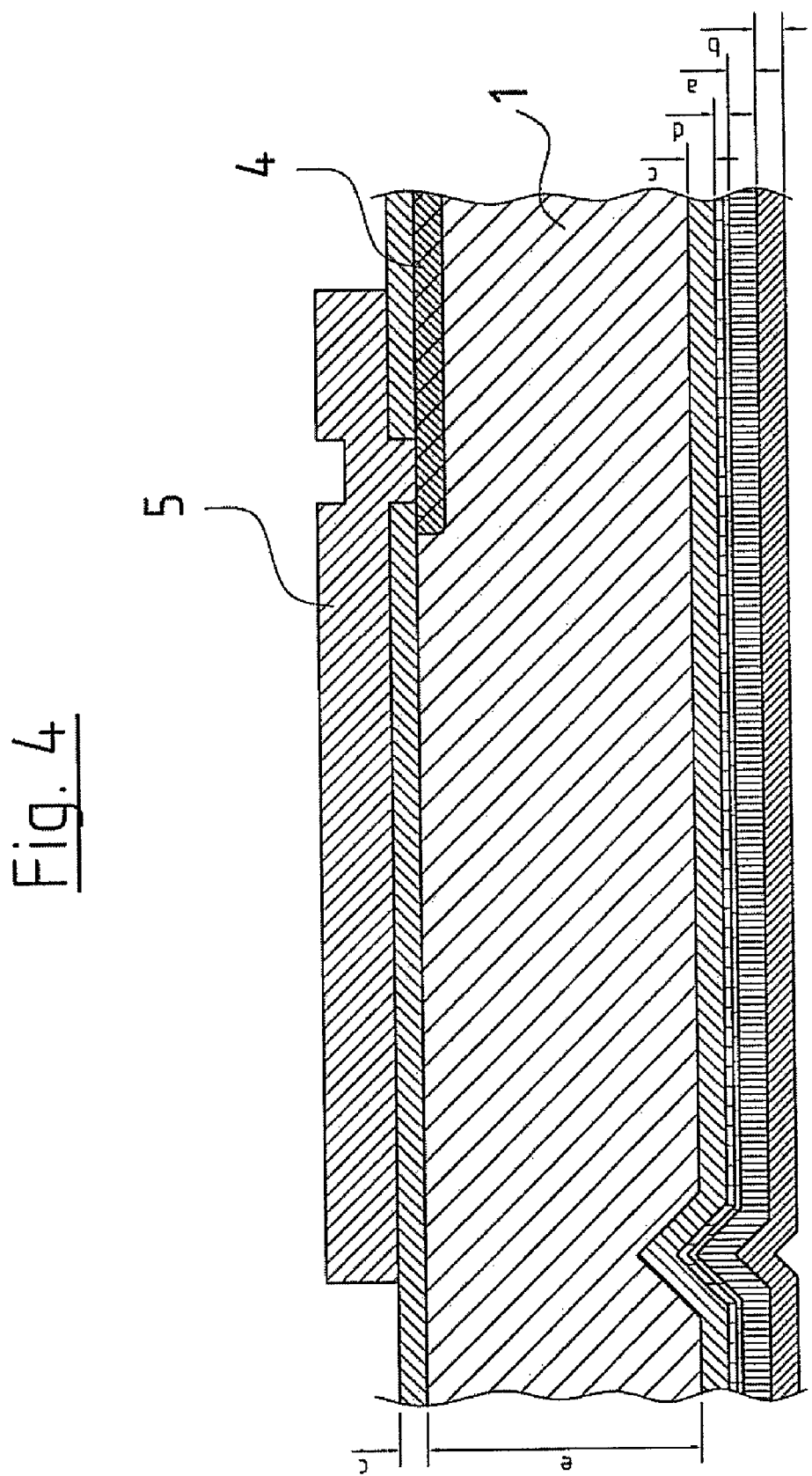

SEMICONDUCTOR STRUCTURAL ELEMENT

CROSS-REFERENCE TO RELATED APPLICATIONS

This application is a Section 371 of International Application No. PCT/EP2007/007697, filed Sep. 4, 2007, which was published in the German language on Apr. 3, 2008, under International Publication No. WO 2008/037334 A1 and the disclosure of which is incorporated herein by reference.

BACKGROUND OF THE INVENTION

The invention relates to a semiconductor component for a sensor, in particular for a pressure sensor or differential pressure sensor, having a semiconductor substrate on which one or more electronic components are formed and connected and at least one side of which is provided with an electrically insulating layer and a metal-containing amorphous protective layer.

Such semiconductor components, in particular for application as a pressure sensor or differential pressure sensor, are known for example from German Utility Model No. DE 297 24 622 U1. They consist of a semiconductor substrate, which is designed to be thin in the region which is to form the later membrane region of the sensor. The actual measurement elements in the form of resistors are also formed in this region and are typically arranged into a measurement bridge and change their resistance characteristics with later application, on account of the membrane extension, which in turn may be used for electronic evaluation as a measure of the prevailing pressure. The silicon substrate, as well as the measurement elements formed thereon, at the upper side and lower side of the substrate, are in each case provided with an insulating layer, typically an oxide layer, which in turn is coated with a corrosion-resistant metal layer, for example a chromium-tantalum layer. This metal layer, with known components, extends at both sides up to the edge, and is interrupted only in the region of the connection contacts. It is designed in an amorphous manner and protects the semiconductor component from contact with a medium whose pressure is measured. This protective metal layer is so thin, that it practically does not prevent the movement of the membrane caused by pressure, but provides a reliable protection.

A semiconductor component designed in such a manner has basically proven its worth. However, with unfavorable process parameters, it does indeed occur that the metal layer does not completely stick to the semiconductor component, which is disadvantageous. Moreover, due to contamination or process instabilities, it may occur that the metal layer is not homogeneous in the relevant region, or comprises defect locations. This may lead, sooner or later, to a defect of such a semiconductor component. Moreover, it has been found, in particular, that if the surface of the semiconductor component is not formed in a completely smooth manner, then defect locations in the metal layer occur particularly frequently where steps or other topographic unevenness are present.

BRIEF SUMMARY OF THE INVENTION

Against this background, it is an object of the invention to design a semiconductor component of the known type, such that the previously mentioned problems are reduced or, where possible, completely avoided, and thus the die yield is improved.

According to the invention, this object is achieved by a semiconductor of the type mentioned at the outset, wherein the electrically insulating layer is covered by at least two amorphous, metal-containing layers of different chemical composition. Advantageous embodiments of the invention are specified in the subsequent description and the drawings.

The semiconductor component according to the invention is particularly envisaged for a sensor, for example for a pressure sensor or differential pressure sensor, but may however also be envisaged for other purposes. It comprises a semiconductor substrate, in which one or more electronic components such as resistors, transistors or the like are formed and connected, and which, on at least one side, is provided with an electrically insulating layer and with a metal-containing amorphous protective layer. According to the invention, the electrically insulating layer is covered by at least two amorphous, metal-containing layers of different chemical composition.

The basic concept of the present invention is to provide the semiconductor substrate with the electronic components formed therein or thereon and with the electrically insulating layer located thereover, not only with a metal-containing amorphous protective layer, as in the prior art, but with at least two amorphous, metal-containing layers, which have different chemical compositions.

This covering with two layers of different chemical composition, given a suitable selection of the chemical composition and of the layer thicknesses, entails significant advantages which, in particular, lie in the fact that the protection of the substrate is significantly improved compared to the prior art. This improvement relates to many aspects, without compromising the movement ability of the membrane and the thermal conductivity, and without noticeably increasing the manufacturing costs. The defect rate of the semiconductor components may be considerably reduced, and thus the die yield increased by the arrangement of two amorphous metal layers, since a defect location in one of the two metal-containing layers typically does not lead to a defect of the semiconductor component, since the metal-containing layer, which lies thereabove or therebelow, continues to ensure the necessary protection.

Moreover, the bonding of the layers among one another may be significantly improved by a suitable choice of the composition of the metal-containing layers. Also, by the arrangement of two layers, not only the mechanical stability, in particular of the membrane, may be increased, but mechanical stress conditions may also be produced in these layers in a targeted manner, in order to compensate external stresses or to avoid certain stress conditions when the membrane is loaded.

It has been surprisingly found that defect locations, as otherwise occasionally occur at topographic edges or with contamination on the substrate in the protective layer, may be avoided on covering with two amorphous, metal-containing layers. The deposition of two thin, amorphous, metal-containing layers of different chemical composition results in a significantly better protection than the deposition of a single metal layer of a corresponding layer thickness.

Advantageously, metals such as tantalum, titanium, iron, chromium, nickel, copper, zirconium, vanadium, niobium, molybdenum, tungsten, manganese, cobalt, ruthenium, rhodium, palladium, hafnium, yttrium, iridium, osmium, rhenium, silver, gold or platinum are applied as metals for the metal-containing layers.

A metal-containing layer within the context of one embodiment of the invention advantageously consists of one of the above-mentioned metals and of a further bonded chemical element or of an alloy of metals as specified above. The metals mentioned above may form binary, amorphous metal alloys with a crystallization temperature of greater than 400° Kelvin, which is particularly favorable for the application concerned here.

A particularly good bonding of the layers among one another, according to a further advantageous embodiment of the invention, may be achieved by the composition of the metal-containing layers being selected such that at least one chemical element of adjacent layers corresponds. If the substrate is coated with an insulating layer in the form of an oxide layer, as is known in the prior art, a particularly good adhesion of the metal-containing layer lying thereon may be achieved when this metal-containing layer is an oxygen compound, thus also an oxide layer. Particularly advantageously, the insulating oxide layer is covered by an amorphous tantalum oxide layer, which then, for its part, is covered by an amorphous chromium-tantalum layer. In this manner, a good adhesion is achieved, on the one hand, between the oxide layer and the tantalum oxide layer, as well as the tantalum oxide layer and the chromium-tantalum layer, on the other hand. The tantalum oxide layer and the chromium-tantalum layer, thereby in each case per se, form a protective layer, which is impermeable to the medium, e.g. water, which prevails on the outer side of the semiconductor component, and is furthermore corrosion-resistant.

If the semiconductor component is constructed of a semiconductor substrate of silicon, then usefully the insulating layer is formed of silicon oxide, the silicon oxide layer is covered by a tantalum oxide layer, and this in turn is covered by a chromium-tantalum layer. The insulating layer may be formed on both sides of the semiconductor substrate, but it must be formed at least on the side on which the strip conductors and wiring carriers are seated, in order to form an electrical insulation with respect to the adjacent, metal-containing layer.

Advantageously, at least one of the metal-containing layers may be designed in an internal-stress induced manner. Preferably, this is not the uppermost layer, but the metal-containing protective layer lying therebelow. Basically, compressive stresses as well as tensile stresses may be induced in one or both of the metal-containing layers. It is, however, particularly preferable if internal stresses in the form of compressive stresses of the magnitude of 50 to 800 MPa are induced, since the tensile stresses in the membrane, which otherwise occur in the case of loading, may be compensated by such a pre-stressing. That is, due to the induced internal stresses, the semiconductor component remains free of tensile stress even with a loading, or however, at least the magnitude of the occurring tensile stresses is reduced. Furthermore, the impingement with compressive stress has a favorable effect on the adhesion characteristics. With the application of the semiconductor component as a pressure sensor or differential pressure sensor, the actual membrane region is thinned out. In the membrane region, the inducing of the compressive stress in at least one of the metal-containing layers has the advantage that the membrane as a whole becomes softer, i.e. deforms to a greater extent, even with lower forces. This, in turn, has the positive effect that a sensor formed with this becomes more sensitive, thus opens up a measurement region to the lower ranges.

It is particularly advantageous if compressive stresses are induced in both metal-containing layers which lie on one another, wherein then the compressive stresses induced in the layer lying further to the outside should be larger than those in the layer lying further to the inside. Thereby, compressive stresses between 10 and 800 MPa induced in the outer, metal-containing layer, and between 10 and 200 MPa induced in the inner, metal-containing layer have been found to be particularly advantageous.

Basically, the attachment of the amorphous, metal-containing protective layers is only necessary on the side of the semiconductor component, which is exposed to the measurement medium, for example which is exposed to the fluid subject to a pressure measurement, and the other side may be protected in a suitable manner by the sensor housing or other measures. However, it is particularly advantageous if both flat sides of the semiconductor component, thus, for example, both sides of the membrane in a semiconductor component provided for pressure measurements, are designed in a corresponding manner, since then the component may furthermore also be applied as a differential pressure sensor, and thus may be impinged by fluid from both sides. Then, advantageously, it is provided on the rear side with an electrically insulating layer and at least two metal-containing amorphous layers of different composition, as has already been described above for the design of the front side of the semiconductor substrate. Advantageously, metal-containing layers which are vapor-deposited on the rear side of the substrate are deposited with a greater layer thickness than on the front side.

The deposition of the individual layers is effected in a manner known per se by vapor deposition with a PVD method (physical vapor deposition). Then, after the doping of the substrate, first the oxide layer is deposited on the front side, and then subsequently, the two amorphous, metal-containing protective layers. It has been found that with the subsequent deposition of the protective layers on the rear side of the substrate, one may achieve a significantly improved processing result, if one does not directly deposit a tantalum oxide layer onto the electrical insulating layer, thus typically the oxide layer, in particular the silicon oxide layer, as on the front side, but one first deposits a mono-metal layer, advantageously a tantalum layer, onto which a tantalum oxide layer is then subsequently deposited. Inadequacies caused by the process may be compensated by this, so that, for example, small contaminations which may not be avoided have no noticeable influence on the quality of the later semiconductor component. With this design too, the upper protective layer of the rear side advantageously consists of a chromium tantalum layer. The deposition of a mono-metal layer before deposition of the metal-containing, amorphous layers does not necessarily need to be effected on the rear side, but usefully always on the side which is processed by vapor deposition after turning the wafer. As the case may be, it may be advantageous to vapour-deposit a mono-metal layer on both sides before depositing the metal-containing, amorphous layers.

The substrate is thinned out into a membrane in the middle region, for forming a pressure sensor or differential pressure sensor, and piezo-resistive resistors are formed in this region within the substrate by doping.

Advantageously, the conductor connections to and between the electronic components, thus for example the resistors, are likewise formed by doping within the substrate, and specifically advantageously by doping with boron. This leads to the fact that the conductor connections are not formed on the surface of the substrate, as in the prior art, but within the substrate, and terminate with the surface in a flush manner, whereby the semiconductor component may be formed in a completely smooth manner in the region of the membrane. This not only has mechanical advantages, but moreover permits an improved adhesion and attachment of the amorphous, metal-containing protective layers, and thus prevents the defect locations in the region of topographic shoulders, which otherwise occasionally crop up.

The metal-containing layers, on manufacture of the semiconductor component, which is typically effected in the form of wafers, are designed such that they end at a distance from the edge of the substrate. Due to the fact that the metal-containing layers are recessed where the wafer is later mechanically separated for producing the individual semiconductor components, no particles of these layers may get into the end-side region of the semiconductor component with the mechanical separation, and thereby form defect locations. Moreover, the metal-containing layers end at a distance from the electrical connections, which are formed by bonds on the substrate, so that no short-circuits may arise.

It is advantageous, in particular for forming a pressure sensor or a differential pressure sensor, but also for other sensors, to manufacture the tantalum oxide layer or the tantalum oxide layers, if these are provided on both sides, with a thickness between 200 and 800 nm, and preferably these should have a thickness between 400 and 600 nm. Insofar as the chromium tantalum layers are concerned, a layer thickness between 400 and 1100 nm is useful, and particularly advantageous are layer thicknesses between 600 and 850 nm.

The mono-metal intermediate layer, e.g. of tantalum, which, as the case may be, is to be deposited onto the rear side, usefully has a thickness of 5 to 25 nm, advantageously between 8 and 18 nm.

Advantageously, the semiconductor substrate in the edge region of the region which is thinned out into a membrane, is designed rounded to the remaining substrate. This design has the advantage that the adhesion of the vapor-deposited layers is improved in this region and defect locations particularly possibly occurring in this region are avoided.

The previously described semiconductor component may be particularly advantageously applied for a pressure sensor or a differential pressure sensor, but the invention is not limited to this, and it may also be applied to other sensors or other applications.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 4 is a further enlarged representation in longitudinal section of another section of the semiconductor component.

DETAILED DESCRIPTION OF THE INVENTION

Figure 1:
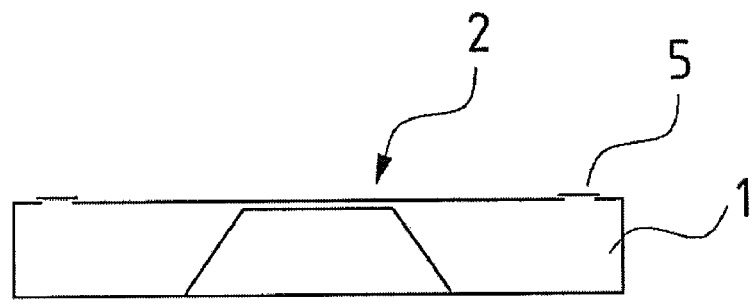
FIG. 1 is a greatly simplified representation of a semiconductor component in a lateral view.

The semiconductor component represented by the figures is provided for a sensor in the form of a pressure sensor or differential pressure sensor. It consists of a semiconductor substrate 1 of silicon, which is thinned out into a membrane 2 in a middle region. Semiconductor components in the form of resistors 3 are formed in the region of the membrane 2 by doping within the substrate 1. The resistors 3 are connected via strip conductors 4 in a manner known per se to a bridge circuit. The strip conductors 4 are likewise formed within the semiconductor substrate 1 by doping with boron and led to wiring carriers 5, so-called bond-pads, which are electrically connected to the strip conductors 4 and mechanically connected to the semiconductor substrate 1 and form the electrical connections of the semiconductor component, to which the electrical wiring is later effected by bonding.

Figure 2:
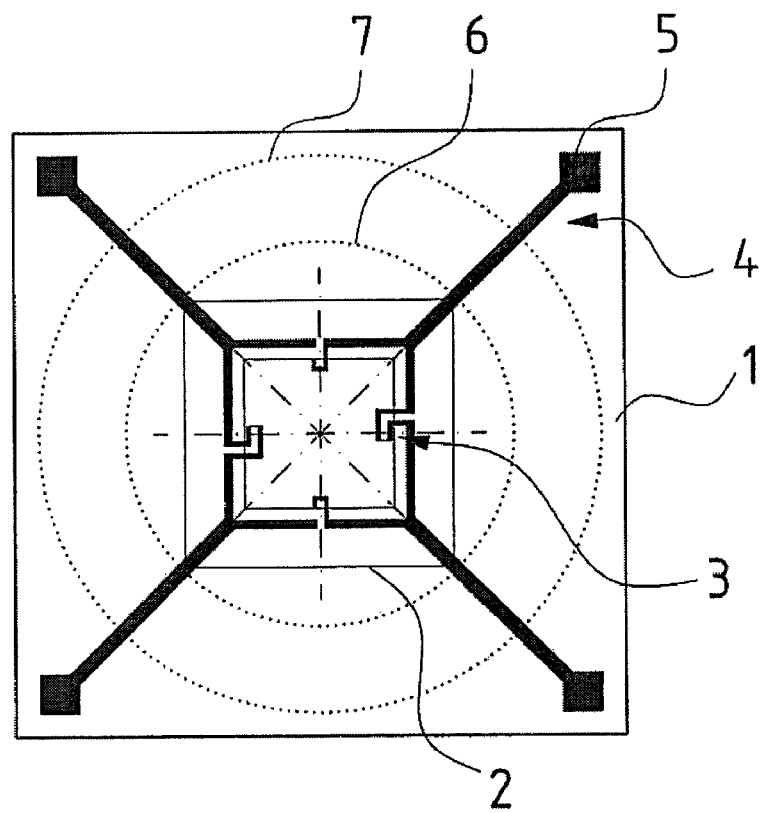
FIG. 2 is a plan view of the semiconductor component according to FIG. 1.

Such a semiconductor component, as is schematically represented by FIGS. 1 and 2, is clamped and sealed in the region which is delimited in FIG. 2 by the dotted lines 6 and 7 and which lies outside the membrane 2, as well as next to the wiring carriers 5, in a manner such that the membrane region may be reached by the medium, whose pressure or differential pressure is to be detected, and may be impinged on one side or both sides, without the wiring carriers 5 coming into contact with the medium.

Figure 3:
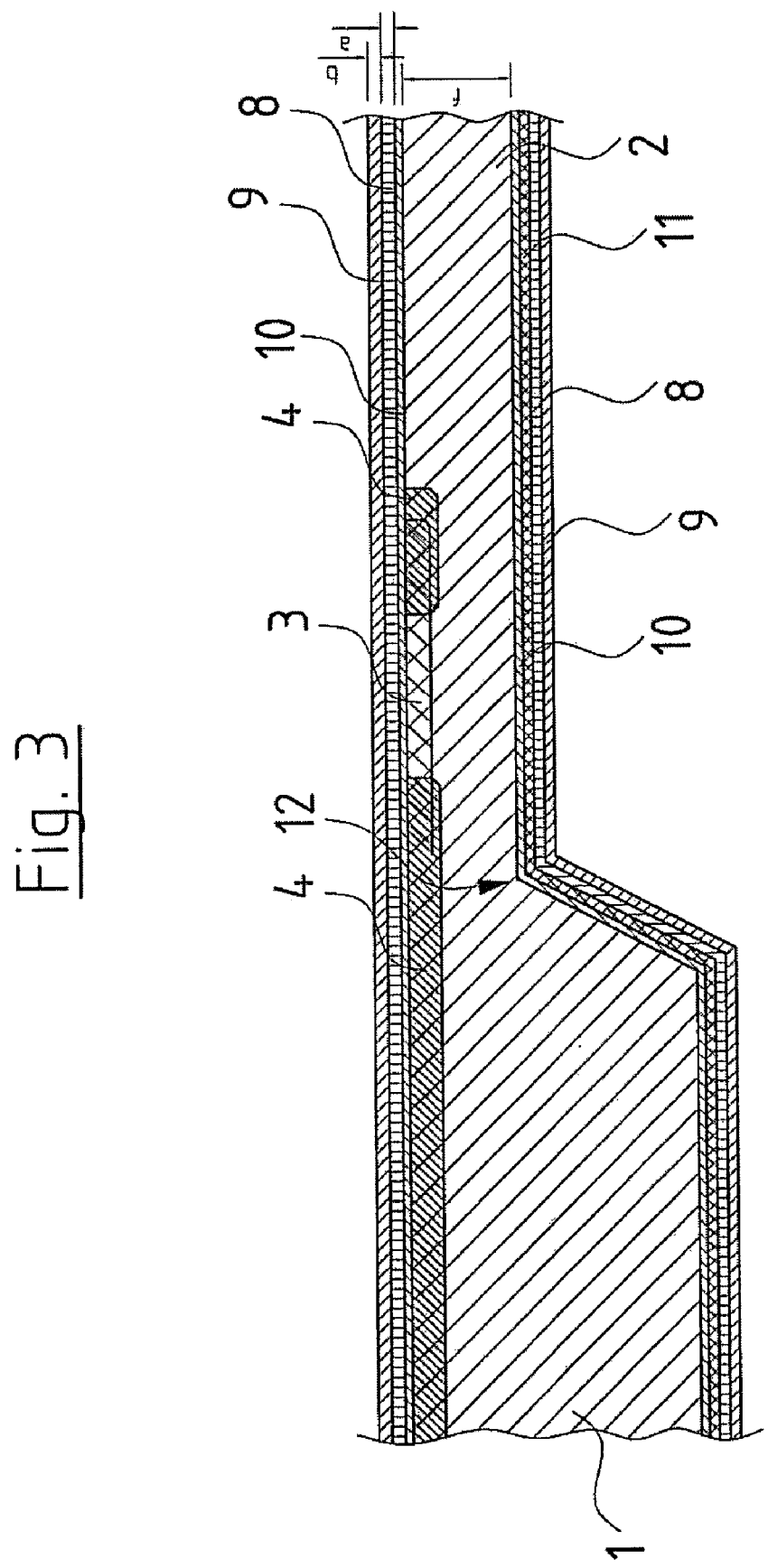
FIG. 3 is an enlarged representation in longitudinal section through a section of the semiconductor component.

Metal-containing protective layers 8 and 9 are provided at both sides, in order to protect the region of the semiconductor substrate 1, which comes into contact with the medium, in particular the membrane 2, from corrosion and other undesirable influences caused by the medium. In order to form an electrical insulation between the protective layers and the semiconductor substrate 1, the substrate 1 is provided on both sides with a silicon oxide layer 10 which extends in a flat manner over the semiconductor substrate 1 on both sides, and is only interrupted in the region of the electrical connection of the wiring carrier 5 to the boron-doped region 4, which lies within the semiconductor substrate 1, as is evident from FIG. 4. These silicon oxide layers 10 which are deposited on both sides, have a thickness c of about 500 nm on the front side (this is the upper side in the FIGS. 1, 3 and 4), thus where the wiring carriers 5 are also attached, whereas the silicon oxide layer 10 on the rear side or lower side has a thickness c of only 350 nm.

On the front side, the silicon oxide layer 10, within the region which is defined by the line 7 and which reaches up to near the edge of the semiconductor substrate 1 as well as ends at a distance from the wiring carriers 5, is provided with a protective layer in the form of an amorphous tantalum oxide layer 8 which has a layer thickness of about 500 nm. This tantalum oxide layer 8, on the one hand, forms an anticorrosive protective layer for the region of the semiconductor substrate 1 which is located therebelow, and on the other hand, also forms an adhesive layer for the amorphous chromium-tantalum layer 9, which is deposited thereabove and which likewise forms a protective layer. The layer thickness b of the chromium tantalum layer is about 800 nm.

On manufacture, a multitude of such semiconductor components in the form of a wafer are manufactured together in a manner known per se, wherein the layers are manufactured in a successive manner by vapor deposition, and after completion of all layers, the wafer is mechanically divided up into individual components. After vapor deposition of the silicon oxide layers 10, first the tantalum oxide layer 8 is vapor-deposited on the front side, as well as subsequently the chromium-tantalum layer 9, whereafter the vapor deposition of the layers is effected on the rear side. Since, with vapor deposition of the tantalum-containing layers 8, 9 on the front side, one may not completely ensure that small quantities are also deposited on the rear side, first a tantalum layer 11 is deposited on the silicon oxide layer 10, before the deposition of the tantalum oxide layer 8 and the chromium tantalum layer 9 on the rear side. This tantalum layer 11 has a layer thickness d of 15 nm, thus is extremely thin, and then a tantalum oxide layer 8 and a chromium-tantalum layer 9 are vapor-deposited thereon, as with the front side. These layers too are amorphous and, as with the protective layers on the front side, are not formed up to the edge of the substrate 1, but end at a distance therefrom.

In order to improve the adhesion of the layers on the rear side of the substrate, which is designed in a stepped manner by the thinned-out region of the membrane 2, the region 12 in which the membrane 2 merges into the remaining, non-thinned region of the substrate 1, is designed in a rounded manner in the transition region. This transition region is indicated at 12 in FIG. 3.

The amorphous protective layers 8 and 9 may be induced with internal stress, induced by a suitable influencing of the parameters on vapor deposition, on one or both sides of the layers 8, 9, as well as on the front side and/or rear side, depending on the application case. With regard to the previously described semiconductor substrate 1 formed of silicon, internal stresses of about 500 MPa are induced in the outer layer 9 and of about 100 MPa in the inner layer 8, and specifically in the form of compressive stresses. Thus, upon loading of the membrane 2, as occurs by impingement of a medium whose pressure or differential pressure is to be determined, this is not loaded in tension, or the tensile loading is at least reduced.

With the represented embodiment example, the thickness of the substrate is approx. 600 μm, and in the thinned-out membrane region 2 the thickness f is about 20 μm. The layer thicknesses of the metal-containing amorphous protective layers 8 and 9 on the rear side of the substrate 1 are about 30% greater than those of the corresponding layers 8, 9 on the front side, as are specified above in detail.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A semiconductor component comprising a semiconductor substrate (1), one or more electronic components (3) formed and connected in or on the substrate, at least a first side of the substrate having an electrically insulating layer (10) and a protective layer covering the electrically insulating layer (10),
   wherein the protective layer comprises at least two amorphous, metal-containing layers (8, 9), the metal-containing layers having different chemical compositions from each other, and
   wherein the metal-containing layers comprise a tantalum oxide layer (8) arranged on the insulating layer (10) and a chromium-tantalum layer (9) covering the tantalum oxide layer.

2. The semiconductor component according to claim 1, wherein the semiconductor substrate (1) comprises silicon, and the insulating layer (10) comprises silicon oxide.

3. The semiconductor component according to claim 1, wherein at least one of the metal-containing layers (8, 9) is induced with internal stress.

4. The semiconductor component according to claim 3, wherein the induced internal stress comprises compressive stresses having a magnitude of 10 to 800 MPa.

5. The semiconductor component according to claim 4, wherein the compressive stresses are induced in both of the metal-containing layers (8, 9), and wherein the compressive stresses in the chromium-tantalum layer are larger than the compressive stresses in the tantalum oxide layer.

6. The semiconductor component according to claim 5, wherein the compressive stresses in the chromium-tantalum layer are between 10 and 800 MPa, and the compressive stresses in the tantalum oxide layer are between 10 and 200 MPa.

7. The semiconductor component according to claim 1, wherein the semiconductor substrate (1) is covered on a second side with an additional electrically insulating layer (10) and at least two additional metal-containing layers (8, 9), the additional metal-containing layers on the second side having different chemical compositions from each other.

8. The semiconductor component according to claim 1, further comprising a layer (11) consisting of only one metal deposited on at least one side of the substrate (1) between the electrically insulating layer (10) and the tantalum oxide layer (8).

9. The semiconductor component according to claim 8, wherein the layer (11) consisting of only one metal is a tantalum layer deposited on a rear side of the substrate (1) between the electrically insulating layer (10) and the tantalum oxide layer (8).

10. The semiconductor component according to claim 9, wherein the tantalum layer (11) has a thickness of 5 to 25 nm.

11. The semiconductor component according to claim 1, wherein the substrate (1) is thinned out into a membrane (2) in a middle region thereof and a piezoresistive resistor (3) is formed in the middle region.

12. The semiconductor component according to claim 11, wherein the semiconductor substrate (1) in an edge region of the region thinned out into the membrane (2) is formed in a round manner toward a remainder of the substrate (1).

13. The semiconductor component according to claim 1, wherein the electronic components (3) are connected by conductor connections (4) formed by boron-doped regions of the substrate (1).

14. The semiconductor component according to claim 1, wherein the metal-containing layers (8, 9) end at a distance from an edge of the substrate (1).

15. The semiconductor component according to claim 1, wherein the metal-containing layers (8, 9) end at a distance from electrical connections (5) on the substrate (1), the electrical connections being formed by bonds.

16. The semiconductor component according to claim 1, wherein the tantalum oxide layer (8) has a thickness of 200 to 800 nm.

17. The semiconductor component according to claim 1, which is a component of a sensor.

18. The semiconductor component according to claim 17, wherein the sensor is a pressure sensor or a differential pressure sensor.

19. A semiconductor component comprising a semiconductor substrate (1), one or more electronic components (3) formed and connected in or on the substrate, at least a first side of the substrate having an electrically insulating layer (10) and a protective layer covering the electrically insulating layer (10),
   wherein the protective layer comprises at least two amorphous, metal-containing layers (8, 9), the metal-containing layers having different chemical compositions from each other,
   wherein an inner of the metal-containing layers is a tantalum oxide layer (8) having a thickness of 200 to 800 nm and an outer of metal-containing layers is a chromium tantalum layer (9) having a thickness of 400 to 1100 nm.

* * * * *